United States Patent [19]
Grantham

[11] Patent Number: 6,017,004
[45] Date of Patent: Jan. 25, 2000

[54] LOCK-DOWN DEVICE AND METHOD FOR PREVENTING COMPUTER EXPANSION CARD FROM BECOMING DISLODGED

[75] Inventor: Dockins W. Grantham, Vienna, Va.

[73] Assignee: Technology Management Systems, Inc., Vienna, Va.

[21] Appl. No.: 09/126,413

[22] Filed: Jul. 30, 1998

[51] Int. Cl.[7] .................................................. G12B 9/00
[52] U.S. Cl. .................. 248/27.3; 248/680; 361/736; 361/752; 361/395; 361/759
[58] Field of Search .................................. 248/620, 680, 248/27.1, 27.3, 222.51, 225.11, 222.41, 73, 500, 309.1, 221.11, 222.11, 621, 681, 587, 594, 604, 628, 626, 607; 361/236, 740, 747, 748, 752, 759, 395

[56] References Cited

U.S. PATENT DOCUMENTS

| | | |
|---|---|---|
| 3,252,679 | 5/1966 | Bell . |
| 4,192,478 | 3/1980 | Coules . |
| 4,434,537 | 3/1984 | Bean et al. . |
| 4,470,100 | 9/1984 | Rebaudo et al. ........................ 361/413 |
| 4,503,484 | 3/1985 | Moxon .................................... 361/395 |
| 4,927,111 | 5/1990 | Takahashi . |
| 4,979,075 | 12/1990 | Murphy .................................... 361/399 |
| 5,099,391 | 3/1992 | Maggelet et al. ....................... 361/395 |
| 5,317,483 | 5/1994 | Swindler ................................. 361/801 |
| 5,575,546 | 11/1996 | Radloff .................................. 312/183 |
| 5,650,917 | 7/1997 | Hsu ........................................ 361/759 |
| 5,822,193 | 10/1998 | Summers et al. ...................... 361/759 |
| 5,883,792 | 3/1999 | Summers et al. ...................... 361/825 |
| 5,909,359 | 6/1999 | Summers et al. ...................... 361/748 |

*Primary Examiner*—Derek J. Berger
*Assistant Examiner*—Tan Le
*Attorney, Agent, or Firm*—Stevens, Davis, Miller & Mosher, L.L.P.

[57] ABSTRACT

A computer card lock-down device is formed from a bowed piece of an insulating plastic, metal coated with an insulating plastic or the like. A first portion of the lock-down device is formed to be flat and has a screw connection. The rest of the lock-down device has an approximately U-shaped cross-section. At a second portion, the U-shaped cross-section forms a slot for engagement with an upper edge of the card. In use, the first portion is held against the face plate of the card with the same screw used to secure the card in the expansion slot, and the second portion engages with the card. The lock-down device can be bowed sufficiently that it contacts the lid of the computer CPU case. The lock-down device exerts a spring force on the card to prevent the card from coming loose from the expansion slot.

9 Claims, 1 Drawing Sheet

LOCK-DOWN DEVICE AND METHOD FOR PREVENTING COMPUTER EXPANSION CARD FROM BECOMING DISLODGED

FIELD OF THE INVENTION

The invention is directed to a lock-down device and method for use in a computer using expansion cards, such as an IBM-compatible microcomputer, to prevent such expansion cards from becoming dislodged, e.g., during shipment.

DESCRIPTION OF RELATED ART

Computers, particularly IBM-compatible microcomputers, use expansion cards to add functions not performed by the motherboard. Such expansion cards can include video adapters, internal modems, sound cards, disk drive controllers, network interface cards and the like and have contact portions which are inserted into expansion slots, generally in the motherboard.

Early personal computer (microcomputer) systems used full-length cards which were inserted into the expansion slots and secured at both ends with screws to the system chassis. Over time, manufacturers continuously improved such cards, adding more features and significantly reducing the size, particularly the length and the height, of the cards. Today, such cards are secured with a single screw to one side of the system chassis.

Although smaller, more powerful expansion cards have provided significant cost savings, they have also increased the service costs of manufacturers, assemblers and resellers of personal computers. Because modern expansion cards are secured on only one end, such cards have a tendency to become partially dislodged during shipment and handling of a microcomputer from the manufacturer's or assembler's plant to the consumer, in which case they are no longer in the required electrical contact with the motherboard. In fact, industry surveys conducted since 1995 on equipment reliability have documented "dead-on-arrival" rates for microcomputers as high as 12%, of which a significant portion is attributed to the dislodging of such cards during shipment.

SUMMARY OF THE INVENTION

It is an object of the invention to prevent expansion cards from becoming wholly or partially dislodged during shipment.

It is a further object of the invention to provide a lock-down device and method for use with expansion cards currently in use to prevent such expansion cards from becoming wholly or partially dislodged during shipment without a requirement to modify the cards themselves.

To achieve this and other ends, the present invention is directed to a lock-down device for use with an expansion card to retain the expansion card in place in a system, the lock-down device comprising: a first portion for engagement with a chassis or other interior portion of the system; a second portion for engagement with the expansion card; and a third portion, which in one embodiment is an intermediate portion between the first portion and the second portion, for, responsive to a component of the system, enabling the lock-down device to exert a force on the expansion card in at least a direction parallel to a plane of the expansion card when the first portion is engaged with the chassis or other interior portion and the second portion is engaged with the expansion card.

The invention is further directed to a method of retaining an expansion card in place in a system, the method comprising: (a) disposing the expansion card in the system; (b) providing a lock-down device as just described; (c) engaging the first portion with the chassis or other interior portion of the system; (d) engaging the second portion with the expansion card; and (e) exerting the force on the expansion card with the lock-down device.

BRIEF DESCRIPTION OF THE DRAWINGS

A preferred embodiment of the invention will now be set forth in detail with reference to the figures, in which.

DETAILED DESCRIPTION OF THE PREFERRED EMBODIMENT

Figure 1:
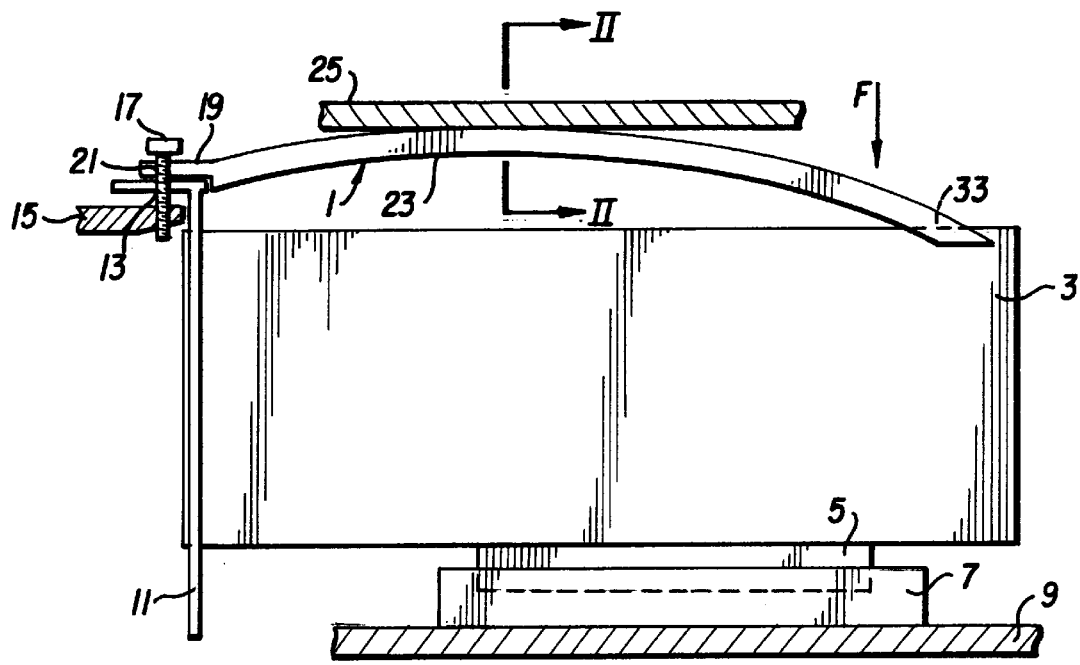
FIG. 1 shows a side view of the lock-down device according to the preferred embodiment installed on an expansion card.

FIG. 1 shows lock-down device 1 according to the preferred embodiment in use with expansion card 3. Expansion card 3 can be of any currently used type, e.g., ISA, PCI or AGP. Alternatively, expansion card 3 can be of an older type, such as VESA local bus or micro-channel architecture, or can be of a type yet to be developed.

Expansion card 3 has contact portion 5 designed to be inserted into expansion slot 7 on motherboard 9. Expansion card 3 also has face plate 11 with screw hole 13 so that expansion card 3 can be secured to system chassis 15 with screw 17.

Lock-down device 1 has first end portion 19 with screw hole 21 for receiving screw 17 so that lock-down device 1 and expansion card 3 can be secured together to system chassis 15. Lock-down device 1 also includes intermediate portion or bowed portion 23, which can be bowed sufficiently that it contacts an inner surface of CPU cover 25 to retain lock-down device 1 in place.

Figure 2:
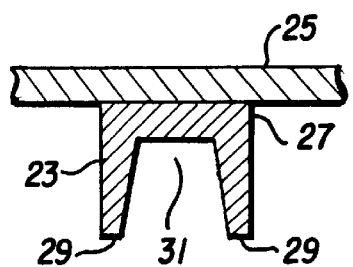
FIG. 2 shows a cross-sectional view of the lock-down device of FIG. 1.

FIG. 2 shows a cross-sectional view of bowed portion 23 taken along lines II—II of FIG. 1. Bowed portion is formed to have an approximately U-shaped cross section with central portion 27 and side portions 29 defining channel 31. This arrangement enhances the structural stability of bowed portion 23. Alternatively, bowed portion 23 could be formed without side portions 29.

Figure 3:
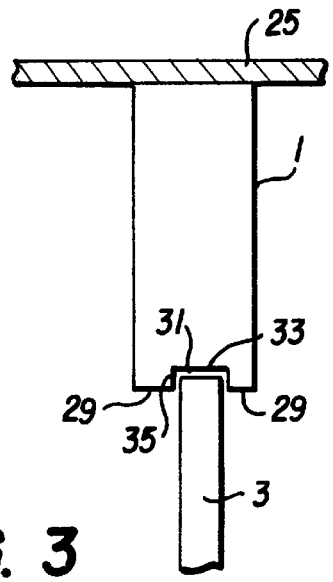
FIG. 3 shows an end view of the lock-down device of FIG. 1 engaging the expansion card.

Lock-down device 1 has second end portion 33 for engaging with expansion card 3. As shown in FIG. 3, at second end portion 33, side portions 29 extend beyond the end of central portion 27 so that channel 31 forms slot 35 to receive expansion card 3.

In use, first, expansion card 3 is installed as it would normally be, except without screw 17. Then, lock-down device 1 is placed on top of expansion card 3 such that slot 35 engages expansion card 3 and such that screw holes 13 and 21 line up. Screw 17 is then screwed into system chassis 15 to hold down both expansion card 3 and lock-down device 1. Second end portion 33 of lock-down device 1 exerts a spring force on expansion card 3 sufficient to prevent expansion card 3 from becoming wholly or partially dislodged during shipment or relocation within an office or home, particularly when bowed portion 23 is bowed sufficiently to contact the inner surface of CPU cover 25. This force is exerted downward, i.e., in the direction of arrow F, parallel to the plane of expansion card 3.

Once the computer is installed in the location in which it is to be used, lock-down device 1 can be either removed or left in place. Also, when an expansion card is replaced as part of an upgrade to the computer, lock-down device 1 is removed from the old expansion card and can then be either reinstalled on the new expansion card or omitted. If the old and new expansion cards are of different dimensions, it may be desirable to obtain a new lock-down device for the new expansion card.

Lock-down device 1 can be made by injection molding. Pre-sized molds or forms are cast, one for each size and angle of bend of lock-down device 1. A non-conductive material is injected into each mold or form and cooled to form lock-down device 1. The non-conductive material can be a non-conductive acrylic or other plastic material. Lock-down device 1 can be made by other methods. for example, a flexible metal strip can be formed into the appropriate shape and coated with a non-conductive material.

While a preferred embodiment of the invention has been set forth above, those skilled in the art who have reviewed this disclosure will readily appreciate that other embodiments can be realized within the scope of the invention. For example, bowed portion 23 could be bowed in a direction opposite from that disclosed, so that bowed portion 23 contacts the upper edge of card 3 and second end portion 33 contacts CPU cover 25. Alternatively, first end portion 19 does not have to be engaged with chassis 15, but instead can contact the inner surface of CPU cover 25, so that bowed portion 23 extends from the inner surface of CPU cover 25 to the upper edge of card 3. Furthermore, lock-down device 1 or a modification thereof can be used in a microcomputer or in any other device having similarly placed cards.

What is claimed is:

1. A lock-down device for use with an expansion card to retain the expansion card in place in a system, the lock-down device comprising:

a first portion for engagement with an interior portion of the system;

a second portion for engagement with the expansion card and for applying a force on the expansion card in at least a direction parallel to a plane of the expansion card when the first portion is engaged with the interior portion of the system and the second portion is engaged with the expansion card, wherein said second portion comprises a bowed portion.

2. A lock-down device as in claim 1, wherein the interior portion of the system is a chassis of the system.

3. A lock-down device as in claim 2, wherein the first portion is adapted to engage with the chassis at substantially a point at which the expansion card is engaged with the chassis.

4. A lock-down device as in claim 3, wherein the first portion has a screw hole for accommodating a screw with which the expansion card and the first portion are secured to the chassis.

5. A lock-down device as in claim 4, wherein the second portion has a slot for engaging the expansion card.

6. A lock-down device as in claim 1, wherein the bowed portion is bowed sufficiently to contact a second interior portion of the system.

7. A lock-down device as in claim 1, wherein the second portion has a slot for engaging the expansion card.

8. A lock-down device for use with an expansion card to retain the expansion card in place in a system, the lock-down device comprising:

a first portion for engagement with an interior portion of the system;

a second portion for engagement with the expansion card; and a third portion for, responsive to a component of said system, enabling said lock-down device to exert a force on the expansion card in at least a direction parallel to a plane of the expansion card when the first portion is engaged with the interior portion of the system and the second portion is engaged with the expansion card, wherein the third portion is bowed.

9. A lock-down device as in claim 8, wherein the third portion is bowed sufficiently to contact a second interior portion of the system.

\* \* \* \* \*